United States Patent
McConaghy

(10) Patent No.: US 7,089,163 B2
(45) Date of Patent: *Aug. 8, 2006

(54) SMOOTH OPERATORS IN OPTIMIZATION OF STRUCTURES

(75) Inventor: Trent Lorne McConaghy, Ottawa (CA)

(73) Assignee: Synopsys, Inc., Mountain View, CA (US)

( * ) Notice: Subject to any disclaimer, the term of this patent is extended or adjusted under 35 U.S.C. 154(b) by 718 days.

This patent is subject to a terminal disclaimer.

(21) Appl. No.: 10/227,858

(22) Filed: Aug. 27, 2002

(65) Prior Publication Data

US 2004/0044503 A1    Mar. 4, 2004

(51) Int. Cl.
*G00F 7/60*  (2006.01)
(52) U.S. Cl. .......................................... 703/2
(58) Field of Classification Search ............. 703/2
See application file for complete search history.

(56) References Cited

U.S. PATENT DOCUMENTS 5,953,517 A * 9/1999 Yin et al. ................... 716/9
6,859,914 B1 * 2/2005 McConaghy ................... 716/4

OTHER PUBLICATIONS

Tsutsui: A comparative study on the effects of adding perturbations tp phenotypic parameters in genetic algorithms with a robust searching strategy; IEEE SMC '99 Conf; pp. 585-591; 1999.*

* cited by examiner

*Primary Examiner*—Hugh Jones
(74) *Attorney, Agent, or Firm*—Bever, Hoffman & Harms, LLP; Jeanette S. Harms

(57) ABSTRACT

A method of identifying technology design candidates from a design space of design candidates leverages specialized operators which are smooth in the sense that the operators are capable of producing small changes in the performance or behaviour when applied to a design to modify it. The method includes determining a smooth operator for effecting incremental structural change to a technology design when the smooth operator is applied to the technology design and then applying the smooth operator to at least one technology design in the population to determine an updated population. The technology designs in the updated population are evaluated to identify a preferred semiconductor technology design. If the stopping condition is satisfied then the search terminates otherwise the steps are repeated.

13 Claims, 13 Drawing Sheets

SMOOTH OPERATORS IN OPTIMIZATION OF STRUCTURES

FIELD OF THE INVENTION

The present invention relates generally to the design problems present in a wide variety of technologies including scheduling problems, optical circuits and communications networks.

BACKGROUND OF THE INVENTION

The problem of structural optimization is to find improved or optimal structural designs from a space of possible structural designs. There is a means to evaluate the performances of each candidate design. A search algorithm traverses the design space getting feedback from the performance measures in order to propose new designs. To traverse the design space, the algorithm applies "operators" that take one or many designs and produce another design from those designs. Other problem domains outside of circuit design include design of neural networks, Bayes nets, industrial designs (e.g. chairs), and schedules.

One way to define the space of possible designs is to begin with initial designs and include all the designs reachable through the application of a finite number of operators. In traditional optimization problems, the design space typically only contains parameters, not structures. This can be called the problem of "parameter optimization." Operators in parameter optimization only vary the parameters of the design, not the structure. An example parameter optimization problem in neural network design is to find the values for all the weights of the neural network that give the lowest mean-squared error in approximating the neural network to fit target data. In structural optimization, there are also one or more structural operators. These operators actually alter the structure of a candidate design. A simple example of a structural operator from the domain of neural network design is to merely remove a randomly chosen hidden node.

Structural optimization has benefits over parameter optimization for the reason that the design space is broadened to include different possible structures. With a broader design space than parameter optimization, there is the potential for even better designs to be achieved.

Unfortunately, structural optimization is typically very inefficient because it takes large amounts of computational effort to optimize structures. A major reason for the inefficiency is that when structural changes are made (i.e. structural search operators are applied), there is typically a low probability of improving the performance measure of the design.

Generally, structural operators are "non-smooth" operators because they typically result in large changes in design behaviour. A non-smooth operator has typically been designed without consideration of the effects that parameters have on changes in behaviour in the specific domain of application. Applying a non-smooth operator typically leads to non-negligible changes in behaviour. So, on average, expected changes in behaviour are high. Large changes in behaviour usually lead to large changes in performance measures. The larger an expected change in a performance measure, the lower the expected probability of successfully improving the measure.

In the neural network design domain for example, consider the application of the non-smooth operator in which a hidden node is randomly removed. In all likelihood, the network's behaviour in terms of flow of signal strengths will be radically changed. A large change in the signal behaviour likely means a large change in the subsequent performance measure, e.g. a large change in mean-squared error. With such a large change in mean-squared error, there is a small likelihood that the change has been for the better. Successful changes to the network's structure are thus rare.

The main benefit of structural optimization over parameter optimization is the ability to create better designs, given enough time, because the scope of possible designs is larger. Unfortunately, structural optimization is too computationally expensive for many applications.

SUMMARY OF THE INVENTION

It is an object of the present invention to mitigate the high computational cost associated with structural optimization.

This invention seeks to eliminate or mitigate these undesirable effects by providing a method of search that uses at least one structural operator specially designed to have a higher probability of successfully improving performance than traditional structural operators.

Advantages of the invention include: the invention can yield better designs than inefficient structural optimization with the same computational effort; the invention can design the same quality of design as inefficient structural optimization but with less computational effort; compared to parameter optimization, the invention can yield better designs, with a more acceptable computational effort than inefficient structural optimization.

A smooth operator is an operator that is explicitly designed to cause, on average, small changes in design behaviour, such that the changes have a much higher probability of successfully improving the performance measures of the design, as compared to a non-smooth operator.

To explicitly design operators that have small expected changes in design behaviour, the key insight is: parameters and structures are closely intertwined. We devise operators that modify a structure, but manage related parameters in a relevant domain-specific manner such that the design's overall change in behaviour is expected to be negligible.

An example smooth operator in the neural network domain is to add a neuron into the middle layer of a neural network, assign all the input weights random values, but assign the output weight a very small value. Thus, this new neuron has just a small effect. Therefore the expected change in signal behaviour of the neural network is negligible—the output nodes are not going to be very affected by the new incoming signal of the new node. This is in contrast to a non-smooth operator, for example, naively adding a neuron of randomly chosen weights which would cause a large expected change in the neural network's behaviour.

According to an aspect of the present invention, there is provided a method of identifying preferred technology design candidates from a population of technology designs, the method comprising: determining a smooth operator for effecting incremental structural change to a technology design when the smooth operator is applied to the technology design; applying the smooth operator to a at least one technology design in the population to determine an updated population; evaluating the technology designs in the updated population to identify at least one preferred technology design candidate; and determining whether the at least preferred technology design candidate satisfies a stopping condition.

According to another aspect of the present invention, there is provided a method of identifying preferred technology design candidates from a population of technology designs, the method comprising: initially seeding the population of technology designs with at least one seed technology design; determining a set of operators for application to the population of technology designs, each operator transforming a technology design to a modified technology design when the operator is applied to the technology design, the set of operators including at least one smooth operator for effecting incremental structural change to a technology design; applying at least one operator from the set of operators to at least one technology design in the population to determine an updated population; evaluating the technology designs in the updated population to identify at least one preferred technology design candidate; determining whether the at least one preferred technology design satisfies a stopping condition; and if the stopping condition is not satisfied, repeatedly further applying operators and evaluating resulting updated populations until the stopping condition is satisfied.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention relates to smooth structural operators, and their application in the technology design domain. By the expression technology design, we refer to the design of any technology having designable aspects including, for example, problems relating to scheduling, chemical processing, control systems, neural networks, regression modelling of unknown systems, molecular synthesis, optical circuits, photonics, communication networks and sensors.

Figure 1:
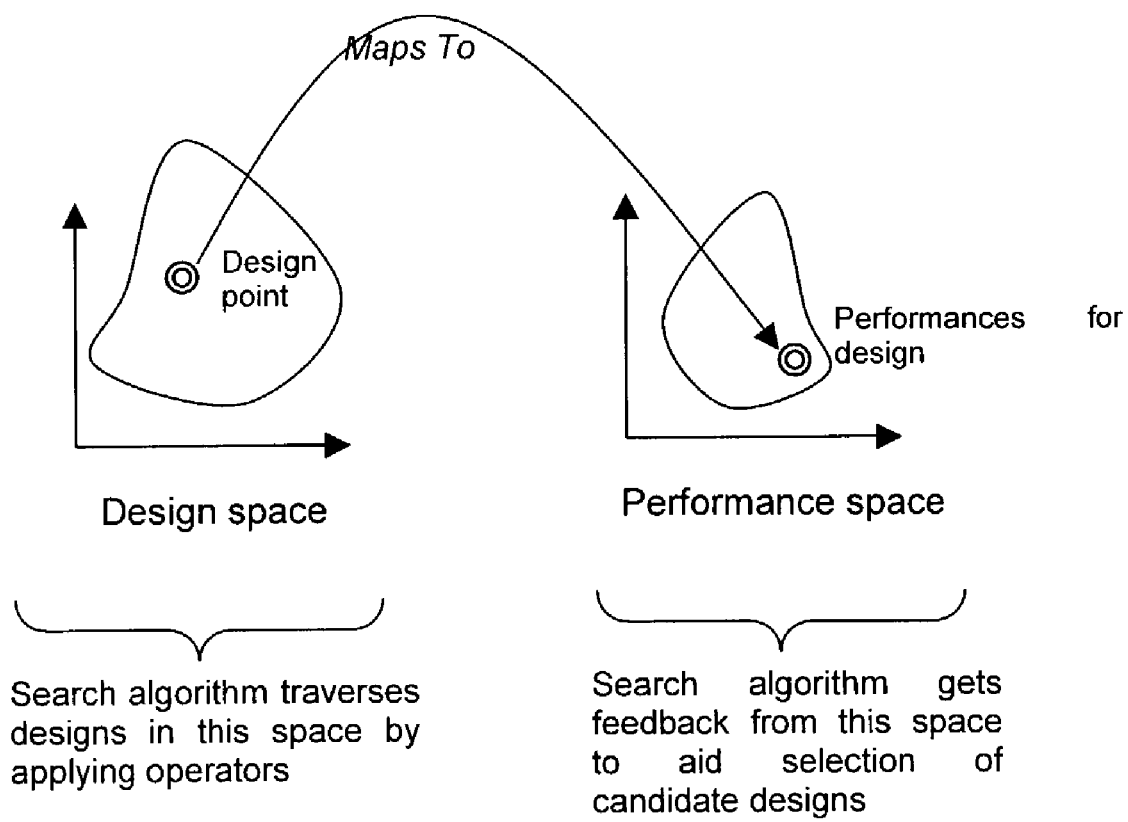
FIG. 1 illustrates the mapping of design space to performance space.

In an optimization problem, there is a mapping from design space to performance space. The design space is the space of all possible designs. The performance space is the space of possible performances. See FIG. 1. For example, in the domain of neural network design: the design is the neural network, which includes neural network architecture of neurons and connections, weights on connections, and parameters in the neurons' activation functions; a performance measure with a corresponding design goal may be, for example, to minimize mean-squared error in fitting to target data.

Figure 2:
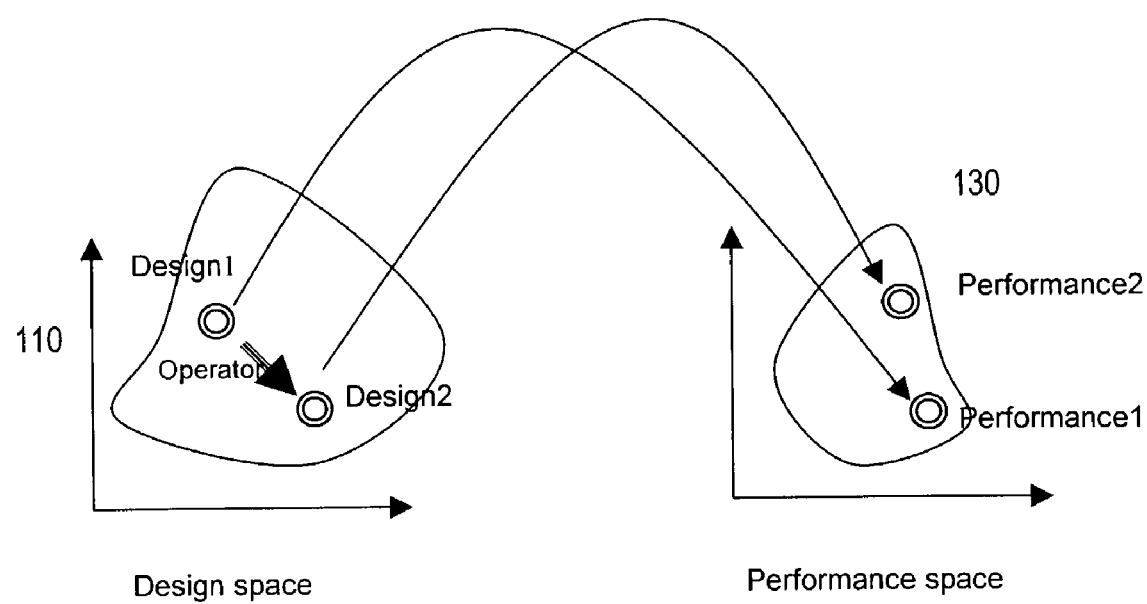
FIG. 2 illustrates the application of an operator to a design in design space to obtain improved performance in performance space.

A search algorithm is used in the optimization problem to traverse the design space, to find designs with improved performance measures. The algorithm traverses by applying operators to step from one or more designs to arrive at new designs. The algorithm uses feedback from the performance values measured to aid its selection of designs during the search. The application of an operator resulting in a design with improved performance can be considered a "successful" step. See FIG. 2.

Figure 3:
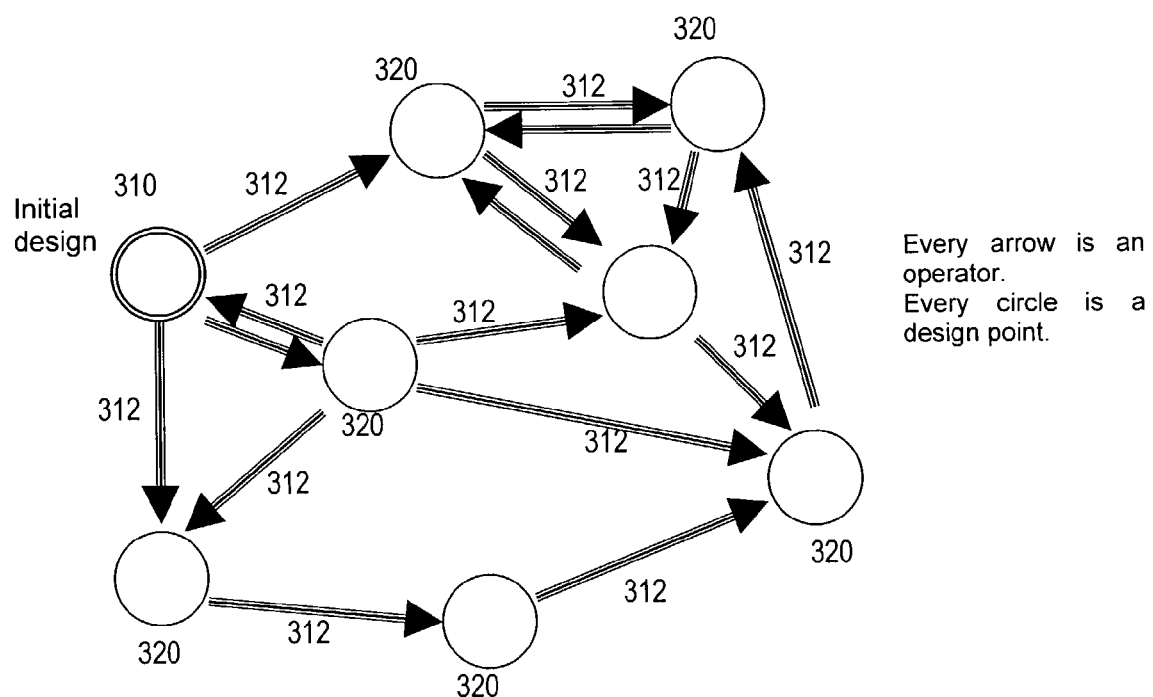
FIG. 3 illustrates design space as a directed graph having nodes which represent designs, and arcs between nodes representing operators on the designs.

If we consider operators that only operate on one design, then we can visualize the design space as a directed graph. As a graph, the nodes or lattice points in the space represent designs, and the arcs between nodes correspond to operators for the transformation of one design into another. Each design point has a corresponding set of performance measures. The search algorithm will be traversing this graph. See FIG. 3.

We now describe the payoff of having the ability to take small steps in the design space. First we present how parameter optimizers leverage this ability, and then we present how this ability is beneficial from a more search-theoretic point of view.

If an algorithm were not be able to achieve particular step sizes, then it would have limited control over its step size. Specifically, if small steps are not possible, then the algorithm will have control limitations. By contrast, if small steps can be taken, then larger steps can be constructed by merely congregating together a series of small steps. Thus, the most important step size to have control over is the small step size.

Parameter optimizers are implicitly built for small step sizes: a small parameter step is simply a smaller numerical change than a large step. Almost all parameter optimization algorithms leverage this distinction about step size as part of their core optimization. For example, gradient-based optimizers need to know step size in order to compute gradients; parameter-optimizing evolutionary algorithms have a higher probability of taking smaller steps than larger steps, e.g. with Gaussian mutation functions.

Without the ability to take control their step size, most parameter optimization algorithms lose the insights upon which they were designed. This has a direct impact on their search effectiveness. If in a worst case, parameter step size were random, most parameter search algorithms would actually degenerate into random search. The efficiency of parameter optimizations is therefore highly dependent on their ability to have tight control over varying their step size, which necessitates being able to take small steps.

We now examine the payoff of being able to take small steps from a search-theoretic point of view. In particular, we motivate the desire to get small changes in performance measures. Let us first define what we mean by a small step: If an operator can usually produce small changes in performance measures, then that operator can be considered a small step, i.e. smooth operator. Small steps get defined in terms of their effect. Thus, an application of a smooth operator will usually bring a small change in performance value. Rephrased: As the size of an operator's step approaches zero, the expected change in performance approaches zero.

In optimization theory, it is known that as the change in the performance measure approaches zero, then the probability of that performance measure improving (i.e. probability of success) approaches 0.5. This is under the assumption that the relation between the design space and the performance has better-than-random structure in it, a reasonable assumption for real-world problems. This result can be readily understood in that: as the change approaches zero, then the performance function approximates a linear plane. Exactly half of the possible steps with size approaching zero would be improvements in the performance measure.

Pulling together the last couple points, the probability of success of an operator approaches 0.5 as the size of the operator's step size approaches 0. This is an important result in its optimism: a sufficiently small step has a good chance of improving a circuit.

We have seen that the payoff of having the ability to take small steps in the design space means that we gain tighter control over step size, and therefore tighter control over optimization and ultimately better efficiency. Conversely, poor control over step size can degenerate to random search. Now, we first show how traditional structural optimization has poor control over step size, and then we describe a generalized technique for resolution of control, i.e. the basis of smooth operators.

Figure 4:
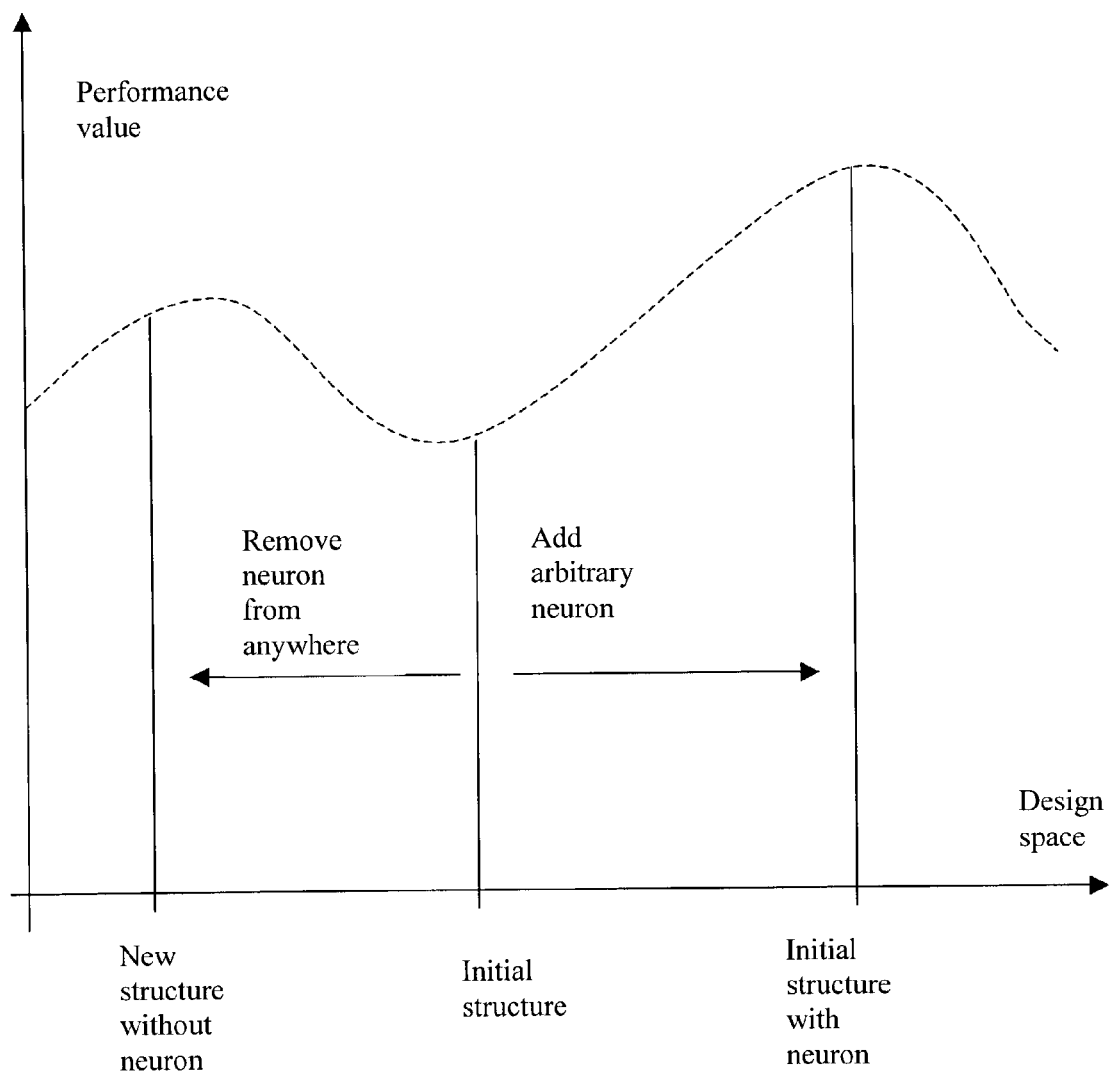
FIG. 4 illustrates the step size of non-smooth structural operators.

In structural optimization, operators are typically designed in a manner so that there is no distinction between "small" or "large" operator steps. It is typically assumed that all structural steps have an expected large change in performance measure, which turns out to be the case because of the technique in designing structural operators. The current technique is, in essence: there is no technique. There has not previously been insight into how to actually achieve "small steps", i.e. smooth operators. Therefore, there has been no way to get control over the step size of structural operators. This means that in the best case, the expected change in performance measures are high and probability of success is low; in the worst case structural optimization runs degenerate into random search. In either case, traditional structural search is inefficient. FIG. 4 illustrates the size of such non-smooth structural steps.

In explicitly designing smooth structural operators the key insight is: parameters and structures are closely intertwined with respect to "behaviour." Let us examine "behaviour" a little more closely. One can imagine an intermediate step in the mapping from design space to performance space, though rarely explicitly considered. That mapping step is the "behaviour." The behaviour is a function of the given designs, but has not yet been abstracted into performance measures as needed by a performance engine. See FIG. 5. For example, in the domain of neural network design, the behaviour is the signal behaviour.

This intermediate mapping step of behaviour was ignored in the design of non-smooth structural operators. What happened then was the following: when a structural operation was applied, even the behaviour of the design would usually change greatly. If that changed greatly, then usually the performance would change greatly, and the probability of success would be low.

Figure 5:
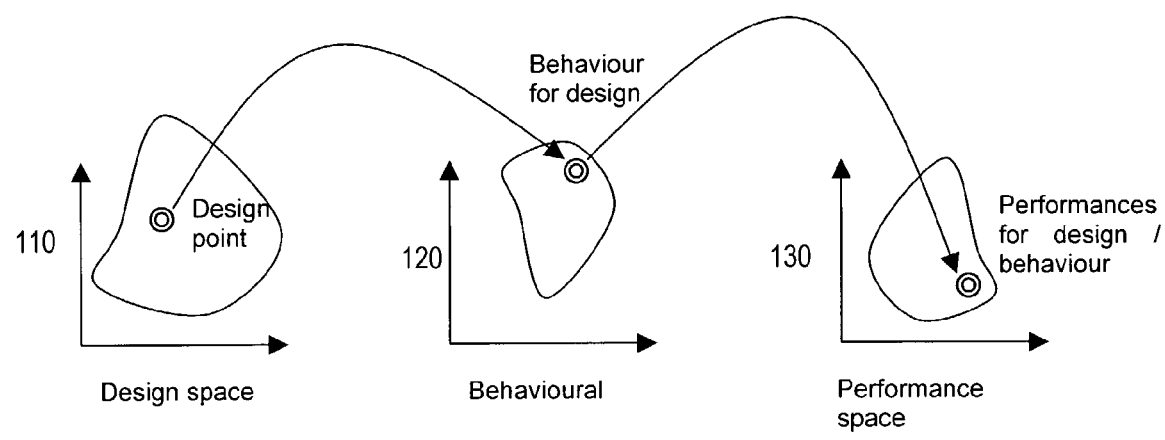
FIG. 5 illustrates an intermediate mapping step showing the behaviour for a design.

Accordingly, to design smooth structural operators, we devise ways to modify a structure, but manage related parameters in a relevant domain-specific manner such that the design's overall change in behaviour is expected to be negligible. Referring to FIG. 5, operators are typically designed taking just design space 510 into account, including "nonsmooth" operators. The intermediate behavioural space 520 is typically not considered as it can "hide" within performance space 530. Smooth structural operators are designed by explicitly acknowledging behavioural space 520, and known domain-specific relations between changes in design space 510 and consequent expected changes in behavioural space 520. Put another way, smooth operators change the structure of the design but roughly maintain the "semantics" of the design. In contrast, non-smooth operators are typically ignorant of the semantics.

By explicitly taking domain-specific knowledge into account, we are designing structural operators with a small expected change in behaviour. This is in contrast to non-smooth operators, which by this point already have a large expected change in behaviour. An example smooth structural operator in the neural network domain is to add a neuron into the middle layer of a neural network, assign all the input weights random values, but assign the output weight a very small value. Thus, this new neuron has just a small effect. Therefore the expected change in signal behaviour of the neural network is negligible—the output nodes aren't going to be very affected by the new incoming signal of the new node. This is in contrast to a non-smooth operator, which would naively add a neuron of randomly chosen weights. In turn, that would cause a large expected change in the neural network's behaviour.

Figure 6:
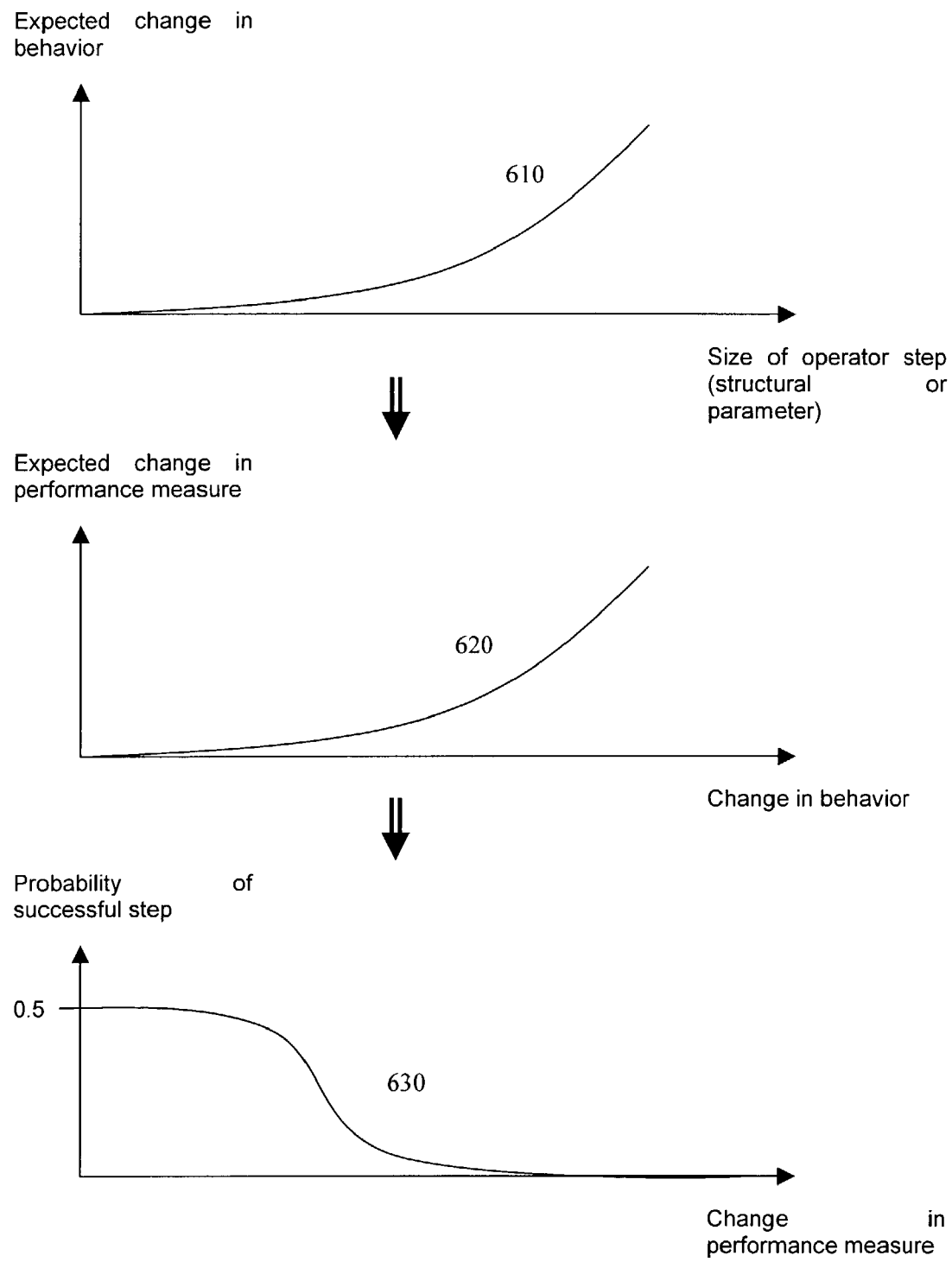
FIG. 6 illustrates the relationship between the size of an operator step and expected change in behaviour; the relationship between the change in behaviour and the expected change in performance; and the relationship between change in performance and the probability of a successful step.

Thus, we can achieve small expected changes in behaviour when applying smooth structural operators. A small expected change in behaviour means a small expected change in performance measures, which means a higher probability of a successful steps. FIG. 6 illustrates. At the core, we achieve the ability to take small structural steps.

Figure 7:
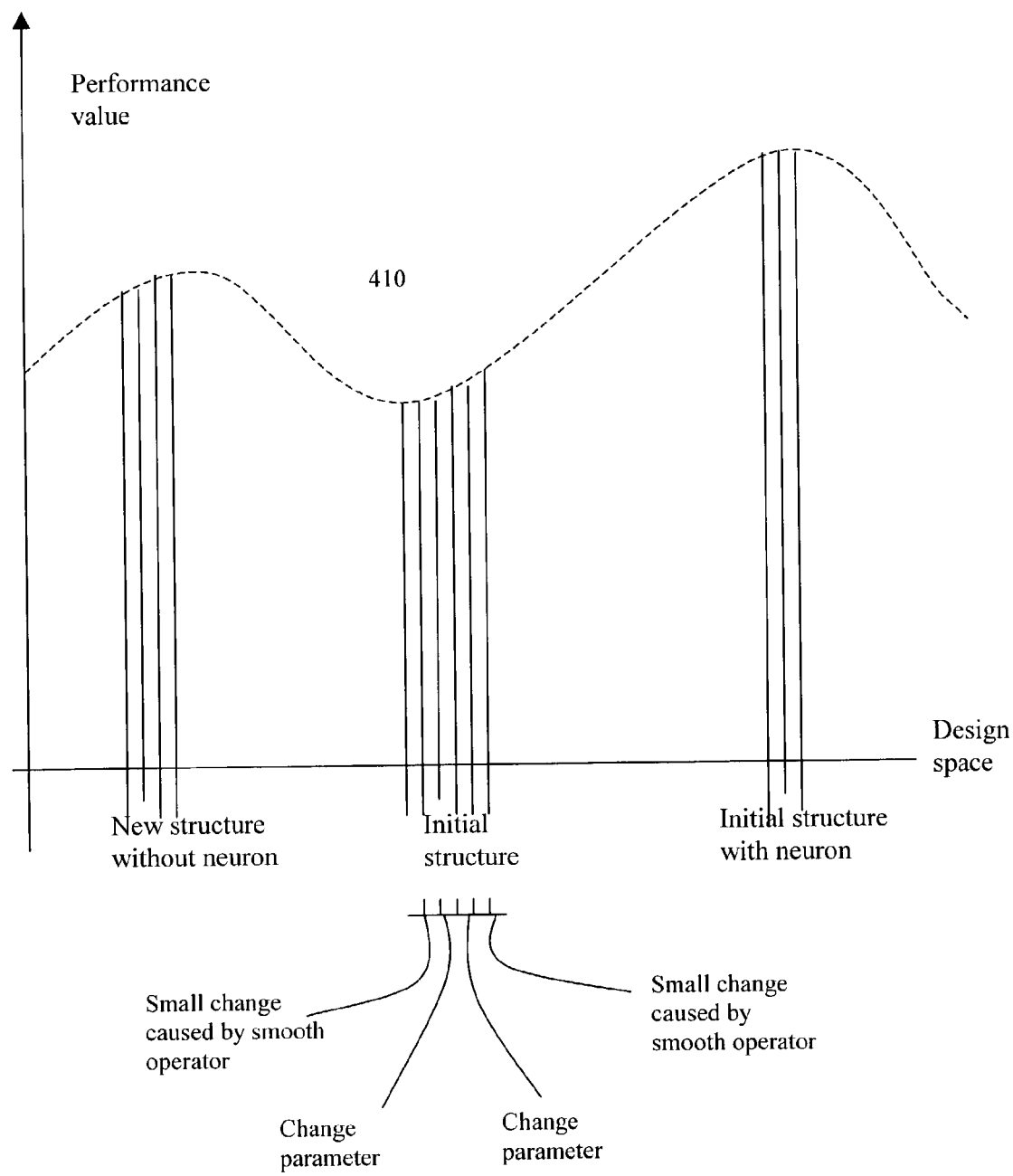
FIG. 7 illustrates how smooth structural operators can complement parameter changing operators.

With small structural steps we win back control over step size in structural searches, as compared to using non-smooth operators. Having this fine-grained control often leads to improved search efficiency and final solution quality. Smooth structural operators are complementary with parameter-changing operators. When a component is "added", we can "carry on" in that direction by changing the parameter values of the added component if the algorithm is designed to do so. When a component is "removed", we cannot "carry on" further. This works well in general for smooth operators in all domains. See FIG. 7.

Figure 8:
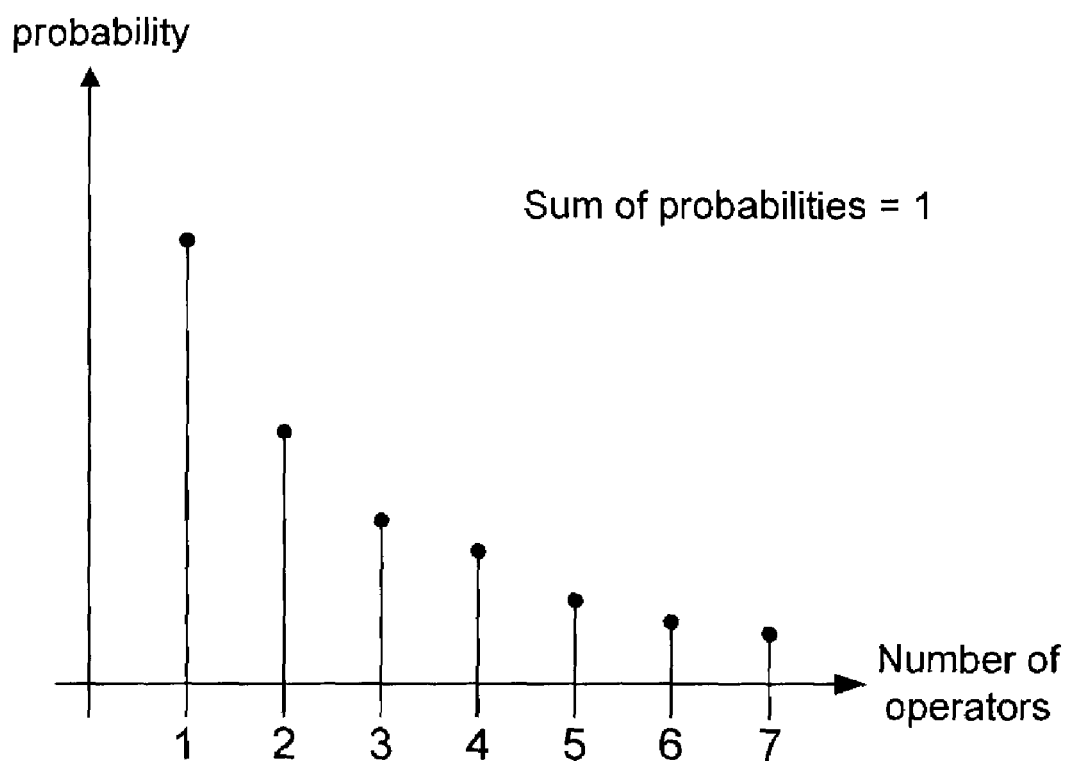
FIG. 8 illustrates an example probability distribution used to determine the number of operators to apply in a step consisting of one or more operators.

We can, of course, still take larger steps by aggregating operators. An example scheme would be to have a pool of possible smooth parameter operators and smooth structural operators. The number of operators to apply is chosen according to a probability distribution, for example as shown in FIG. 8. Each application of an operator would involve randomly choosing an operator from the pool and applying it to the design.

The high-level approach for leveraging smooth operators for structural optimization to a new problem domain can be broken into a series of steps, as follows:

1. Define the problem generally, e.g. how to measure performance
2. Devise operators based on design "behaviour" for that domain
3. Embed the structural operators into the chosen optimization system
4. Define the problem specifically, e.g. performance targets
5. Apply the structural optimization system, starting from one or more seeds.

Of course, another high level approach for leveraging smooth operators is merely re-using the existing system which already has the operators designed and embedded:
1. Define the problem generally, e.g. performance targets
2. Apply the structural optimization system, starting from one or more seeds.

Figure 9:
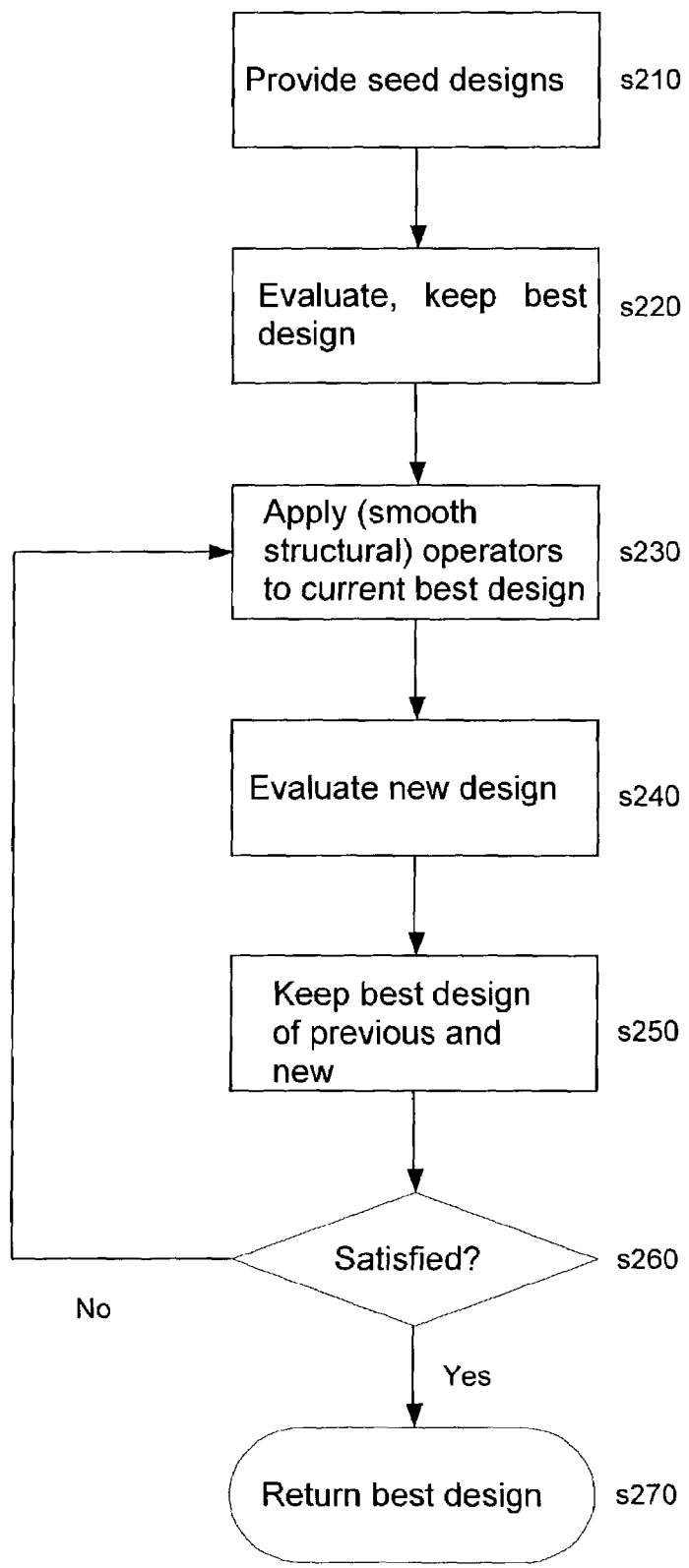
FIG. 9 illustrates the steps of a search engine incorporating smooth operators of the present invention.

We now describe an example structural optimization algorithm that has smooth structural operators embedded within it. This corresponds to FIG. 9. Initially, seed designs are provided s210. The performances of the seed designs are evaluated, and the best design is selected s220. Then, one or more operators (including at least one smooth one sometimes) are applied to the selected design resulting in a new design s230. The performance of the new design are evaluated s240. If the new design is better than the previous best, it is kept as the best design and the previous best is discarded; otherwise the new design is discarded and the previous best is maintained 250. If this design satisfies a stopping criterion s260 then the best design is returned as the search results s270; otherwise, the method re-loops back to the step of applying the operators s230.

Figure 10:
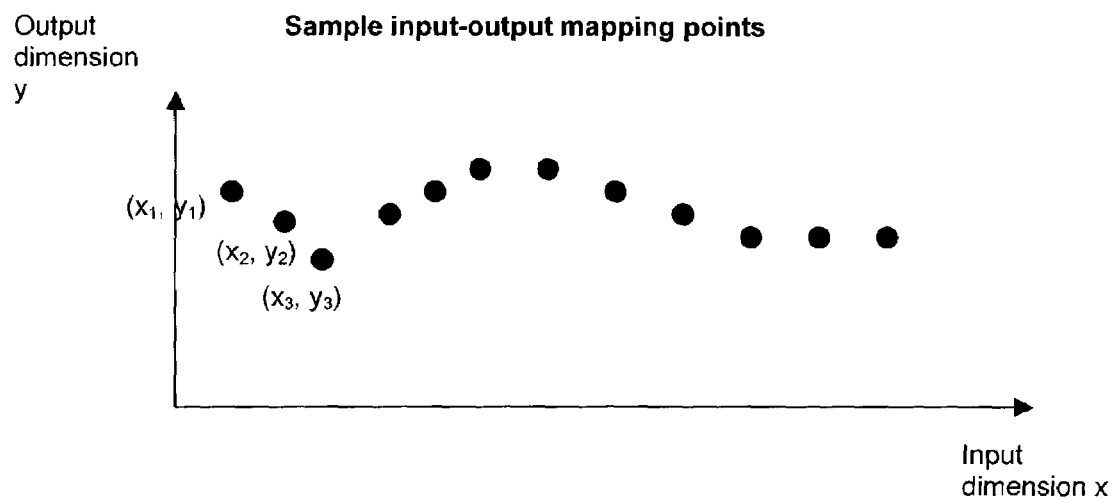
FIGS. 10 to 14 illustrate an example of the present invention in the domain of neural networks.
Figure 11:
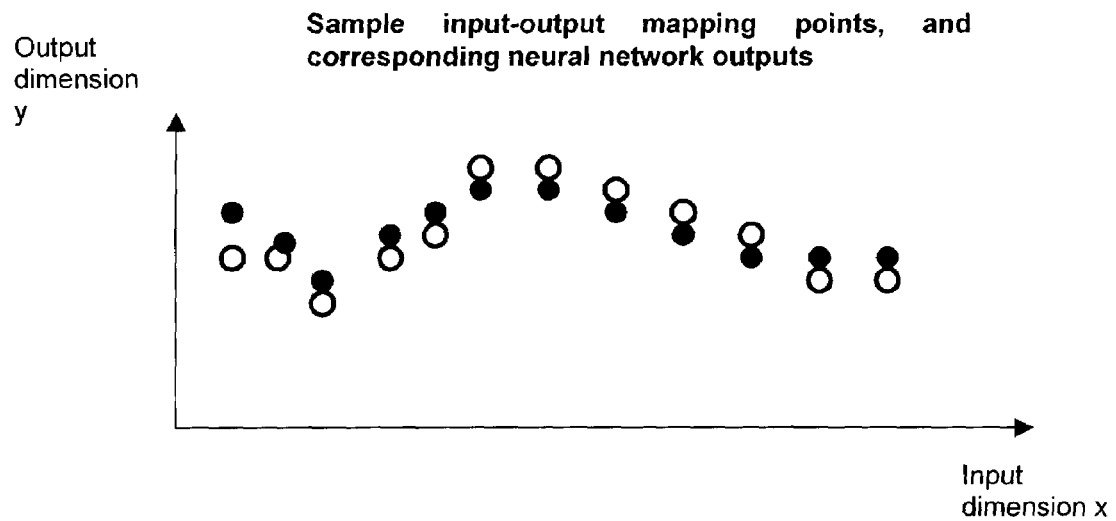

The following is an example of applying the high-level methodology plus the algorithm to a problem in the domain of neural network design. The first step was to define the problem generally. The problem was to structurally optimize a neural network to perform regression, i.e. to "fit a curve" from a set of sample input-output mapping points. In this case it was just a single input dimension and a single output dimension, such that the set of points is a set of pairs {(x1, y1), (x2, y2), . . . , (xn, yn)} where n is the number of points. The mapping points are shown in FIG. 10. The performance measure used is the difference between the desired output and the actual output, i.e. mean-squared error. The desired output is merely the sample output mapping points. The actual output is computed by giving the input mapping points to the neural network, and "simulating" the neural network to produce the neural network's output points. See FIG. 11.

Figure 12:
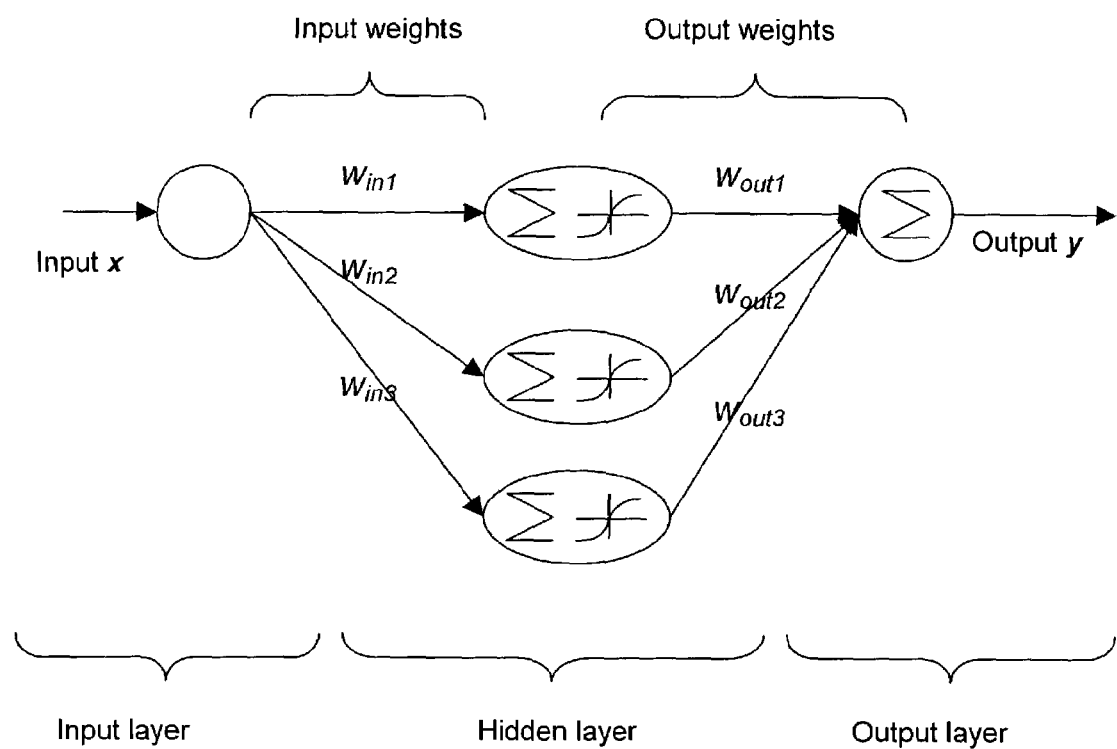

It was decided to only have one hidden layer and only a feedforward weights, and only the pre-set activation functions of the neurons. While this made the neural network more tightly constrained than necessary, even these sorts of neural networks are quite powerful. The architecture is shown in FIG. 12.

Operators were devised for this domain. These included: increase/decrease an input weight; increase/decrease an output weight, and replace an "open circuit" with a neuron with a very small output weight and vice versa. The limited number of structural operators effectively managed the architectural constraints that had been decided.

The next step was to embed the structural operators into the chosen optimization system, which already existed as a piece of software residing on a computer system. The operators were embedded as new modules of code that would be called by the structural optimization software as its search operators. The problem was defined more specifically. In this case, it was merely: The goal is to minimize the mean-square error. The next step was to apply the structural optimization, providing a seed. The output of this application was a new structure, optimized from the seed.

Figure 13:
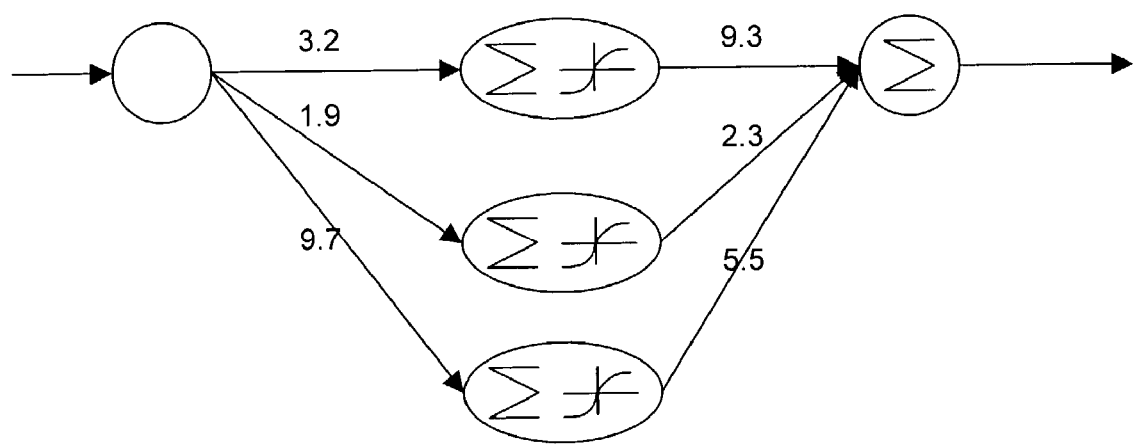

The following is the example continued, within the operations of the specific structural optimization algorithm implemented in software as a structural optimization system. The abstract version of these steps are in FIG. 9. The input to the optimization system is the seed. In this case, an architecture with three hidden nodes was used, with all the weights were randomly initialized. See FIG. 13.

The seed was then evaluated. This was done by "simulating" the neural network on each of the sample input mapping points to get the neural network output points, i.e. the "actual output points". These output points were compared to the desired output points, and a mean-squared error in their difference was computed, i.e. the performance measure. The seed got re-labeled as the "best design so far."

Figure 14:
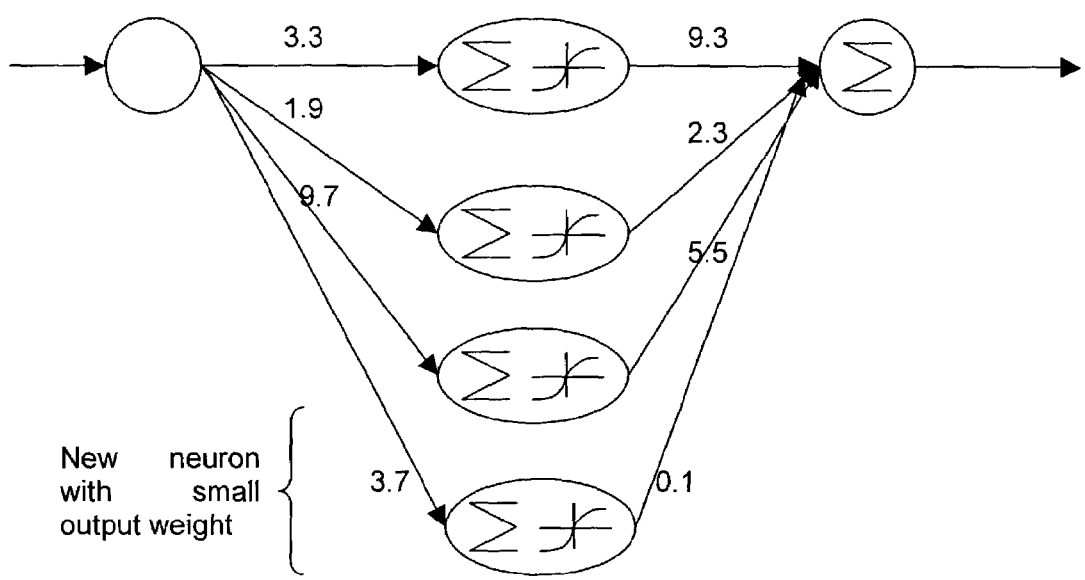

The next step was to apply one or more operators to the design. The algorithm in this case was designed to just apply one randomly chosen operator. The operator chosen was to increase an input weight. It was applied to the second input weight, win2, changing the weight from 3.2 to 3.3 to produce a new candidate design. The next step was to evaluate the new candidate design. Its mean-squared error was measured. The next step was to compare the mean-squared error of the new design to the best design so far. The new design had higher error than the best design so far. Therefore, the new design was discarded and the best design so far was remembered. The next step was to identify if the search criteria were satisfied so that the search could stop. The desired mean-squared error target was not hit, so therefore the search had to be continued, by re-looping back to the step of applying operators. The next step was to apply one or more operators. The operator chosen was to replace an open circuit with a neuron having small output weight. This was applied to produce a new neural network design, as shown in FIG. 14.

The new neural network design was then evaluated, i.e. its mean-squared error was measured. In this case, the new design had lower mean-squared error than the previous best circuit. So, it became the new "best design" and the old "best design" was discarded. The search was still not satisfied, so the system re-looped back to the step of applying operators. The next operator was randomly chosen to decrease an output weight. So, the first output weight, wout1, was reduced from 9.3 to 9.2 to produce the new design. The new design was evaluated; it was compared to the previous best; the new design won, so it became the new "best design." The search was still not satisfied, so the system re-looped. The next operator was to increase an output weight. This was applied to the newest neuron's output weight, changing it from 0.1 to 0.2. The new design was evaluated; it was compared to the previous best; the new design won, so it became the new "best design." The search was still not satisfied, so the system re-looped. After many more re-loops, there had been many successful steps and unsuccessful steps. Weights had been changed, neurons had been added and removed. The performance measure (mean-squared error) was now sufficiently low that it satisfied the search's termination criteria. So, the system did not re-loop. Rather, it returned the best design, and the search terminated.

The technique of smooth operators can be embedded into a variety of possible algorithms, because they are just a unique set of operators that are devised to provide particular advantages. The only requirements are: they must be general enough to work with structural operators, and there is a means of comparing goodness of designs with each other. Algorithms that can use smooth structural operators, therefore, include: greedy hill climbing, evolutionary algorithms, tabu search, simulated annealing, A-teams, many others, and combinations thereof.

Automated Design of "Flow" Networks: "Flow" networks tend to have some sort of "pipe" that channels objects through it. Schematic-level circuits are a type of "flow" network. Other specific domains include the design of: plumbing for buildings, city piping, optical communications networks, HVAC (Heating, ventilation, and air-conditioning) systems, electromagnetic systems, power grids, road networks, train networks, industrial processes and control systems.

The insights here are like the insights in schematic-level circuit design. Certain component/parameter combinations are almost like a "plugged" pipe that virtually stops flow, i.e. an open circuit. Other component/parameter combinations are almost like an unlimited-flow pipe, which has unimpeded flow, i.e. a closed circuit. We leverage such combinations.

Examples of what an almost—"plugged" pipe include:
a far narrower-than-usual, longer-than-usual water pipe
a very poor-performing optical fibre link
a far narrower-than-usual, longer-than-usual heating vent
a poor, narrow road (e.g. single lane road, perhaps dirt)
a tiny machine in an industrial process that would almost certainly be considered a "bottleneck"-causing machine
a control system block with a multiplying transfer function, multiplying <<1

Examples of what an almost-unlimited-flow pipe include:
a monstrous-diameter water pipe
a state-of-the-art, multiply-parallelized set of fiber optics links
a 10-lane freeway
a control system block with a multiplying transfer function, multiplying is approximately 1.0

Automated Design of 3D Structures. Specific domains include design of micro electromechanical systems (MEMS), 3D silicon structures (device design and larger designs), industrial designs (e.g. chairs), and mechanical design (e.g. car engines, airplane bodies), 3D optical designs (e.g. solid state lasers), buildings (e.g. houses, skyscrapers), civil engineering (e.g. bridges, trusses) and unit processes. The idea here is very similar to automated circuit layout, except our structures have a 3d abstraction rather than a 2d or 2.5d abstraction.

The insight for smooth operator design in this domain is that 3d structures with a small profile are very close to "nothing". Examples of what is almost "nothing" include:
a far tinier-than-usual mirror on MEMS
a thinner-than usual layer of silicon in device design or some optical designs
a tiny "stub" of a table leg for industrial designs
a far smaller-than-usual piston for car engine design
a far smaller-than-usual window in a house The problem of automated neural network topology design involves automatically determining the topology and parameters of a neural network to maximize, minimize, or meet specific design goals, such as minimizing regression error and maximizing generalizability. Factors in topology design typically include the connectivity between any two given neurons (inputs and outputs for each neuron), and the choice of basis functions. Often this is simplified into a choice of the number of hidden layers and the number of neurons per layer, with a relatively "regular-looking" connectivity. Also, connection weights and basis function parameters typically need to be designed.

A non-smooth operator may be: adding a neuron, and randomly connecting its inputs and output to a number of neurons, all randomly chosen. Each connection weight would all have a default value or a randomly chosen value. The basis function is chosen or with a default, with parameters chosen randomly or with a default. Smooth equivalents would be:
1. same as non-smooth, except all input connection weights are near-zero;
2. same as non-smooth, except the output connection weight is near-zero; and
3. same as non-smooth, except that the basis function makes the output of a neuron almost zero.

A non-smooth operator may be: removing a neuron, and all its associated connection weights. A smooth approximate equivalent would be to only remove a neuron if one or more of the following conditions was true:
all input connection weights are near-zero;
output connection weight is near-zero; and
basis function makes the output of a neuron almost zero A non-smooth operator may be: adding a connection between the output of one randomly chosen neuron and the input of another randomly chosen neuron, with the connection weight being either randomly chosen or a default. A smooth equivalent would be the same, except the connection weight would be near-zero. A non-smooth operator may be: removing a randomly-chosen connection. A smooth near-equivalent would be to only remove connections that have near-zero weights. There would likely be parameter-changing operators of some sort, e.g. parameter mutate, or parameter optimize.

The insights for smooth operator design in this domain are:
if the weights on all inputs to a neuron are almost zero then that neuron will (usually) have virtually no effect;
if the weight on a neuron's output is almost zero then that neuron will (usually) have virtually no effect;
if the basis function of a neuron makes the output of a neuron almost zero then that neuron will (usually) have virtually no effect; and
near-zero connection weights in general have virtually no effect.

The automated design of bayesian networks is very similar to automated neural network design, except now the neural network weights are bayesian network probabilities. Insights include: an arc in which "probability(x|y)=very low" is almost equivalent to no arc at all. The problem of automated design of mathematical functions is just like that of neural networks, except in functions the outputs of a "neuron" can only act as inputs to one other neuron. This makes the function into a tree, whereas the neural network is a graph. The smooth operator insights for neural networks therefore apply equally to the insights for mathematical functions.

The above-described embodiments of the present invention are intended to be examples only. Alterations, modifications and variations may be effected to the particular embodiments by those of skill in the art without departing from the scope of the invention, which is defined solely by the claims appended hereto.

I claim:

1. A method of automatically identifying preferred technology design candidates from a population of technology designs, the method comprising:
    (a) determining only a smooth operator for effecting incremental structural change to a technology design when the smooth operator is applied to the technology design, wherein determining the smooth operator includes acknowledging a behavioural space and known domain-specific relations between changes in a design space and consequent expected changes in the behavioural space;
    (b) applying the smooth operator to at least one technology design in the population to determine an updated population;

(c) evaluating the technology designs in the updated population to identify at least one preferred technology design candidate; and (d) determining whether the at least one preferred technology design candidate satisfies a stopping condition and, if so, then identifying the at least one preferred technology design candidate.

2. The method of claim 1, further comprising repeating steps (b) to (d) until the stopping condition is satisfied.

3. The method of claim 2, wherein the determining whether the at least one preferred technology design candidate satisfies a stopping condition comprises comparing the performance value of the at least one preferred technology design candidate to a predetermined value, the stopping condition being satisfied if the performance value meets or exceeds the predetermined value.

4. The method of claim 2, wherein the performance value of the at least one preferred technology design candidate is the objective function value of the at least one preferred technology design candidate, the objective function being a mapping from design space to a corresponding space of objective function values.

5. The method of claim 1, wherein determining a smooth operator for effecting incremental structural change to a technology design comprises determining a plurality of smooth operators.

6. The method of claim 1, wherein applying the smooth operator to at least one technology design in the population comprises applying a plurality of smooth operators in sequence.

7. The method of claim 2, wherein the stopping condition comprises a resource limitation.

8. The method of claim 7, wherein the resource limitation is a limit to the number of times that steps (b) to (d) are to be repeated.

9. The method of claim 7, wherein the resource limitation is a limitation on an amount of computation time to be expended.

10. The method of claim 7, wherein the resource limitation is a limitation on an amount of elapsed time permitted.

11. The method of claim 1, wherein the steps (a) to (d) are automated in a search engine.

12. A method of automatically identifying preferred technology design candidates from a population of technology designs, the method comprising:

initially seeding the population of technology designs with at least one seed technology design;

determining a set of operators for application to the population of technology designs, each operator transforming a technology design to a modified technology design when the operator is applied to the technology design, the set of operators including only smooth operators for effecting incremental structural changes to a technology design;

applying at least one operator from the set of operators to at least one technology design in the population to determine an updated population;

evaluating the technology designs in the updated population to identify at least one preferred technology design candidate;

determining whether the at least one preferred technology design candidate satisfies a stopping condition and, if so, then identifying the at least one preferred technology design candidate; and if the stopping condition is not satisfied, repeatedly further applying operators and evaluating resulting updated populations until the stopping condition is satisfied.

13. In structural optimization of technology designs using a search engine, a computer-readable program product embodied on a computer readable medium that when executed by the computer, causes the computer to identify preferred technology design candidates from a population of technology designs, the program product comprising:

means for initially seeding the population of technology designs with at least one seed technology design;

means for determining a set of operators for application to the population of technology designs, each operator transforming a technology design to a modified technology design when the operator is applied to the technology design, the set of operators including only smooth operators for effecting incremental structural changes to a technology design;

means for applying at least one operator from the set of operators to at least one technology design in the population to determine an updated population;

means for evaluating the technology designs in the updated population to identify at least one preferred technology design candidate; and means for determining whether the at least one preferred technology design candidate satisfies a stopping condition and, if so, then identifying the at least one preferred technology design candidate.

* * * * *